United States Patent [19]

Peters

[11] 4,392,287
[45] Jul. 12, 1983

[54] QUARTZ RESONATOR PROCESSING SYSTEM

[75] Inventor: Roswell D. M. Peters, Rustburg, Va.

[73] Assignee: The United States of America as represented by the Secretary of the Army, Washington, D.C.

[21] Appl. No.: 174,771

[22] Filed: Aug. 1, 1980

[51] Int. Cl.³ ............................................. H01L 41/22
[52] U.S. Cl. ................... 29/25.35; 228/6 R; 228/47; 228/221
[58] Field of Search ................ 29/25.35; 427/100; 228/4.1, 5.1, 6 A, 6 R, 49 R, 121, 221, 47

[56] References Cited

U.S. PATENT DOCUMENTS 3,724,739 4/1973 Anderson et al. ............... 228/3.1
4,300,272 11/1981 Hafner et al. ..................... 228/18

Primary Examiner—Carl E. Hall
Assistant Examiner—P. W. Echols
Attorney, Agent, or Firm—Nathan Edelberg; Jeremiah G. Murray; Anne V. Dougherty

[57] ABSTRACT

Disclosed is a single chamber ultra-high vacuum processing system for the production of hermetically sealed quartz resonators wherein electrode metallization and sealing are carried out along with cleaning and bake-out without any air exposure between the processing steps. The system includes a common vacuum chamber in which is located a rotatable wheel-like member which is adapted to move a plurality of individual component sets of a flat pack resonator unit past discretely located processing stations in said chamber whereupon electrode deposition takes place followed by the placement of ceramic covers over a frame containing a resonator element and then to a sealing stage where a pair of hydraulic rams including heating elements effect a metallized bonding of the covers to the frame.

18 Claims, 10 Drawing Figures

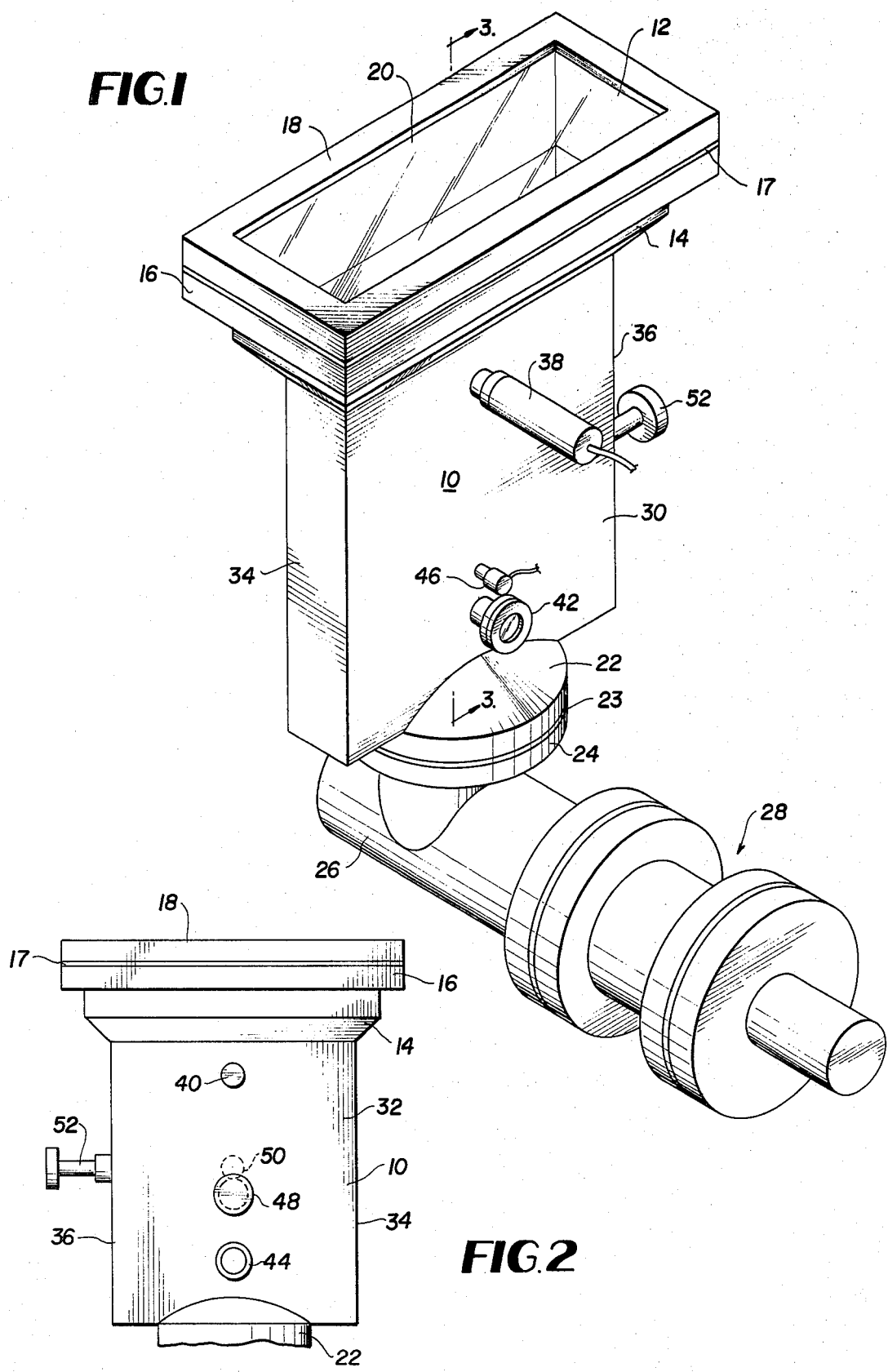

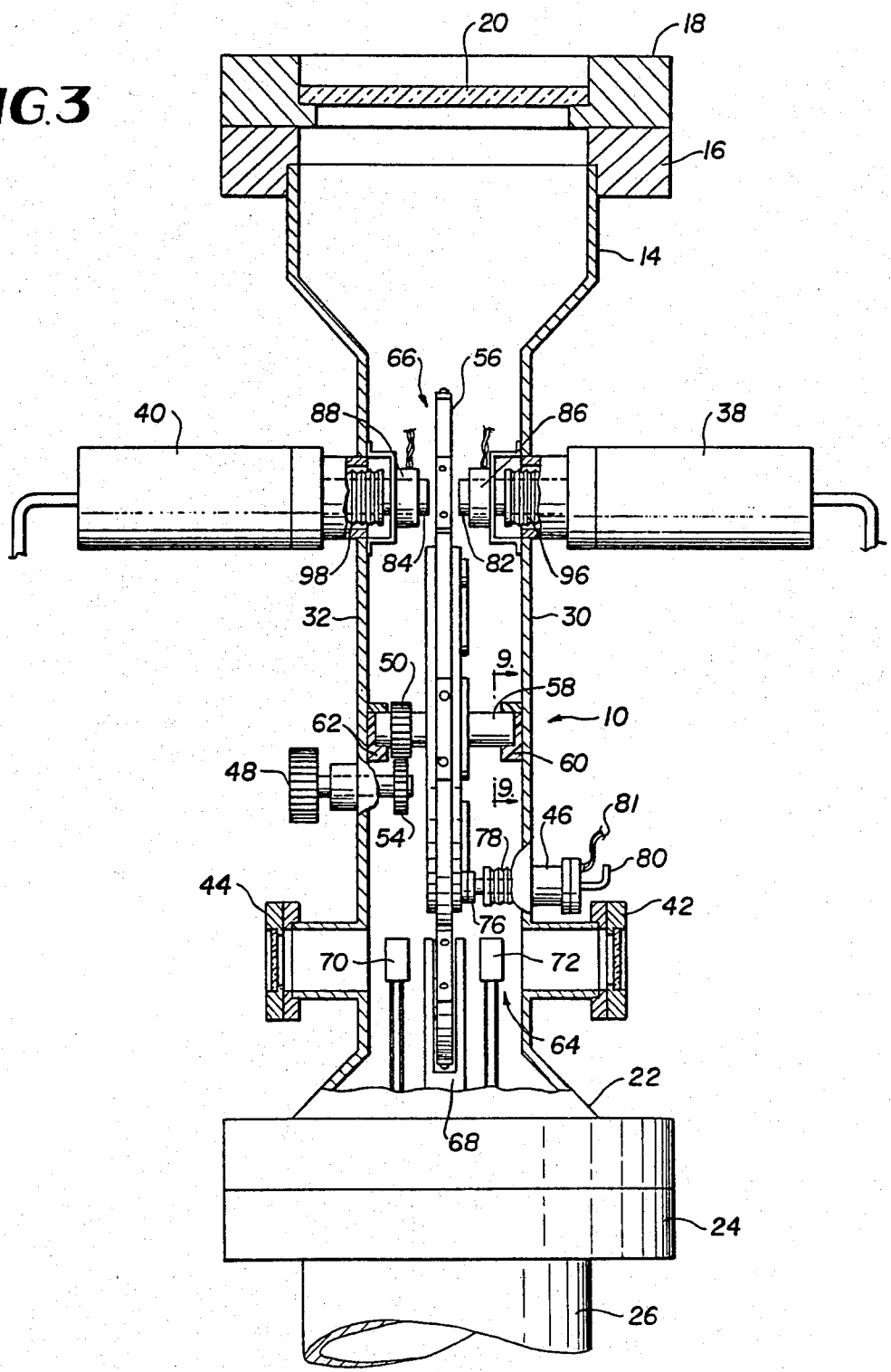

QUARTZ RESONATOR PROCESSING SYSTEM

The invention described herein may be manufactured and used by or for the Government for governmental purposes without the payment of any royalties thereon or therefor.

BACKGROUND OF THE INVENTION

This invention relates to high vacuum apparatus and more particularly to apparatus for processing precision quartz crystal resonators mounted in ceramic flat pack enclosures.

The commercial quartz resonator industry at present normally uses separate systems for the respective processes of cleaning, electroding, and final sealing of quartz crystal resonator components; however, such systems expose the components to air between each step. This air exposure contaminates the units and contributes to changes in the frequency of the resonator during its shelf life and to higher effective resistances in the final product.

In U.S. Pat. No. 3,914,836 entitled, "Method for Processing Quartz Crystal Resonators", Erich Hafner, et al., which issued on Oct. 28, 1975, and is assigned to the assignee of the present invention, there is disclosed a plurality of processing steps for fabricating quartz crystal resonators in a high vacuum system where the exposure to air is eliminated between steps. This patent further outlines a high vacuum system for carrying out this process. In U.S. Pat. No. 4,300,272 entitled, "High Vacuum Continuous Cycle Fabrication Facility", which issued Nov. 17, 1981, in the names of Erich Hafner, et al., which is also assigned to the assignee of the present invention, there is disclosed an in-line modular unit configuration embodying such a processing system. The teachings of these inventions are specifically incorporated herein by reference.

It is an object of the present invention, therefore, to provide a new and improved ultra-high vacuum system for processing precision quartz resonators.

It is another object of the present invention to provide a quartz resonator processing system which effects a plurality of processing steps without intermediate exposure to air.

Still another object of the present invention is to provide a quartz crystal resonator processing system which is relatively inexpensive and designed for a relatively small volume of production.

SUMMARY

These and other objects of the present invention are provided for in a single or common ultra-high vacuum chamber containing means for electrode deposition and sealing of quartz resonator components and when desirable, means for cleaning and bake-out. Plural sets of resonator components are inserted into respective assembly slots formed in a generally circular wheel-like component holder which is rotatably mounted in the chamber. The component holder is rotated such that the component sets are sequentially moved past discrete processing stations whereupon electrode deposition takes place followed by placement of cover members on each side of the frame containing a resonator element followed by a hermetic sealing of the cover members to the frame. Upon completion, the component holder is removed from the chamber and the assembled units are removed. The system is operated from outside the vacuum chamber and includes appropriate view ports for monitoring the sequence of fabrication.

DESCRIPTION OF THE DRAWINGS

FIG. 1 is a front perspective view generally illustrative of the preferred embodiment of the subject invention;

FIG. 2 is a back planar view of the embodiment shown in FIG. 1;

FIG. 3 is a sectional view of the embodiment shown in FIG. 1 taken along the lines 3—3;

DESCRIPTION OF THE PREFERRED EMBODIMENT

Figure 4:
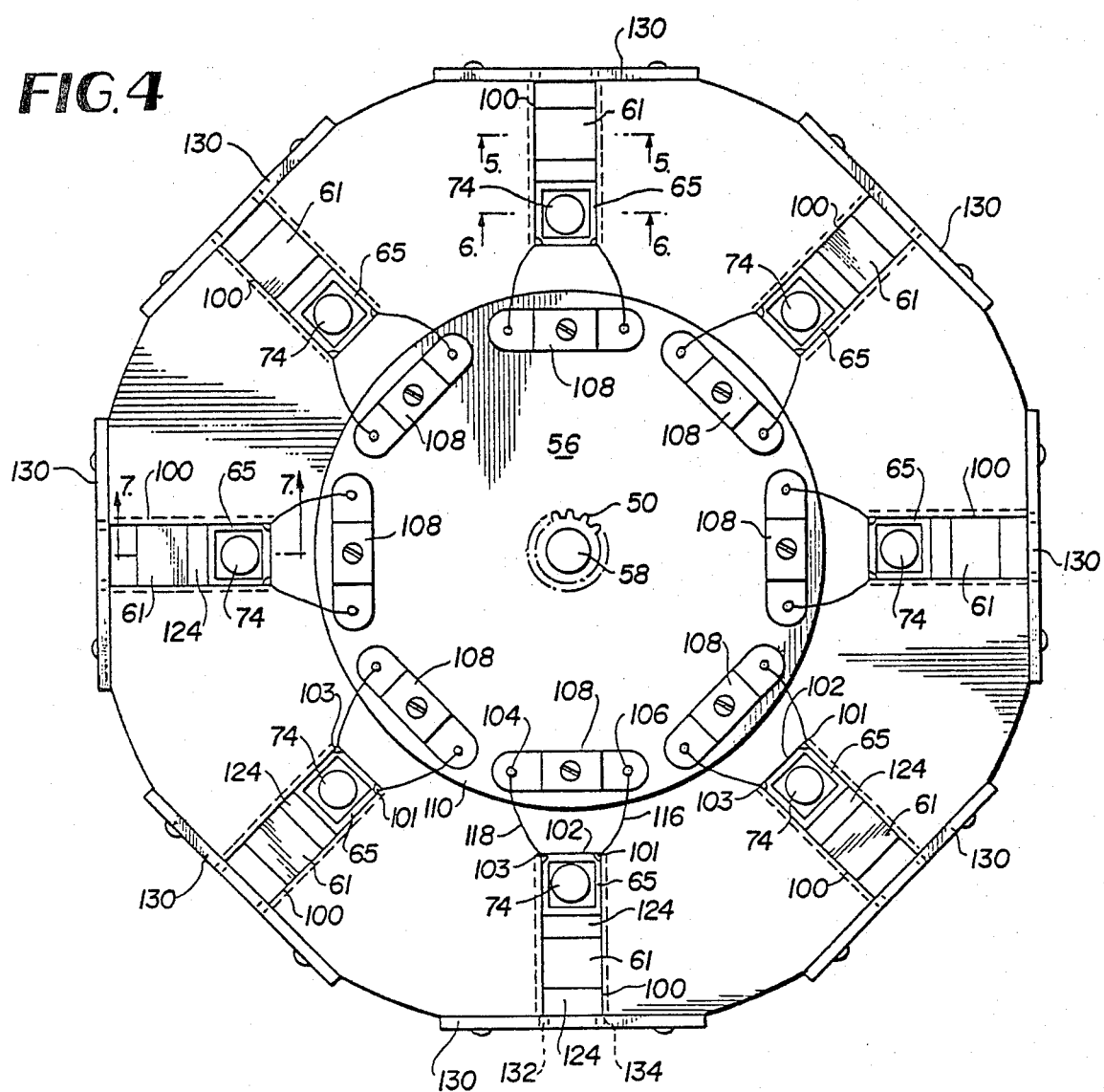
FIG. 4 is a side planar view of a wheel-type of component holder contained in the embodiment shown in FIG. 1.

Referring now to the drawings, wherein like reference numerals refer to like parts throughout, reference is first made to FIG. 1 wherein reference numeral 10 designates a generally rectangular housing which is adapted to embody an ultra-high vacuum chamber including a top viewport 12 which is formed at one end of the chamber. The chamber has an outwardly diverging flange section 14 terminating in a rim 16 which is adapted to receive in contact therewith a gasket 17 intermediate a like shape frame 18 containing a glass panel 20. When positioned as shown in FIG. 1, an operator can easily see down into the interior of the housing 10. At the opposite end of the housing, there is located a circular flange section 22 which is adapted to be joined through a gasket 23 to the flange section 24 of a gate valve 26 which is coupled to a high vacuum pump 28. The last two pieces of apparatus are devices which are well known to those skilled in the art and need not be elaborated on further for an understanding of the subject invention.

Considering now FIGS. 2 and 3 in conjunction with FIG. 1, the housing 10 includes a pair of front and rear broad walls 30 and 32 as well as a pair of opposing side walls 34 and 36. A pair of hydraulic cylinder actuators 38 and 40 are mounted on the upper portion of the broad walls 30 and 32 for purposes which will become evident as the following description proceeds. A pair of relatively smaller view ports 42 and 44 are located on the lower portion of the walls 30 and 32 adjacent the flange portion 22. A linear electrical feedthrough device 46 containing a pair of electrical contacts, not shown, is mounted on the broadwall 30 above the view port 42. On the opposite broadwall 32 (FIG. 2) there is located a rotary member 48 which is coupled to a central shaft 50 located inside the housing 10. On one side wall 36 there is located a linear feedthrough and mechanical actuator device 52 which is coupled to a cover positioning sub-assembly, not shown, of which more will be said as the present description continues.

Figure 9:
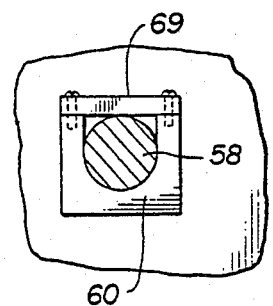
FIG. 9 is a sectional view of FIG. 3 taken along the lines 9—9.

Referring now more particularly to FIG. 3, the rotary actuator 48 is adapted to be turned by an operator and couples to a gear 54 which meshes with a gear 50 to turn a component assembly wheel 56, the details of which are shown in FIG. 4. The wheel 56 is centrally located within the high vacuum chamber 10 and rotates about a spindle 58 which rests upon opposing bearing blocks 60 and 62. The spindle is held in position by an element 69 (FIG. 9) which keeps the gears in engagement.

Figure 5:
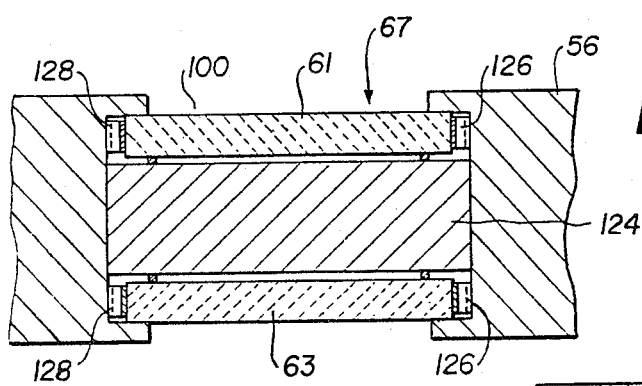
FIG. 5 is a sectional view of the component holder shown in FIG. 4 taken along the lines 5—5.
Figure 6:
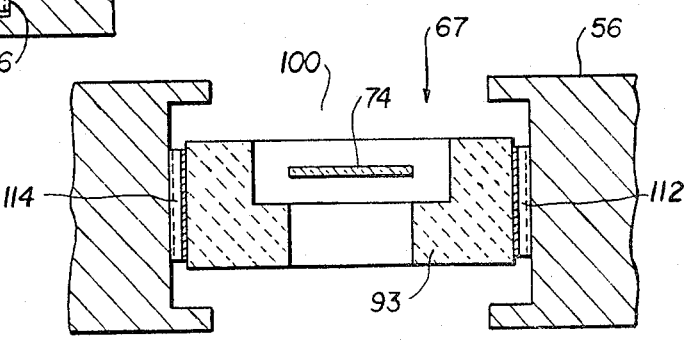
FIG. 6 is a sectional view of a component holder shown in FIG. 4 taken along the lines 6—6.
Figure 7:
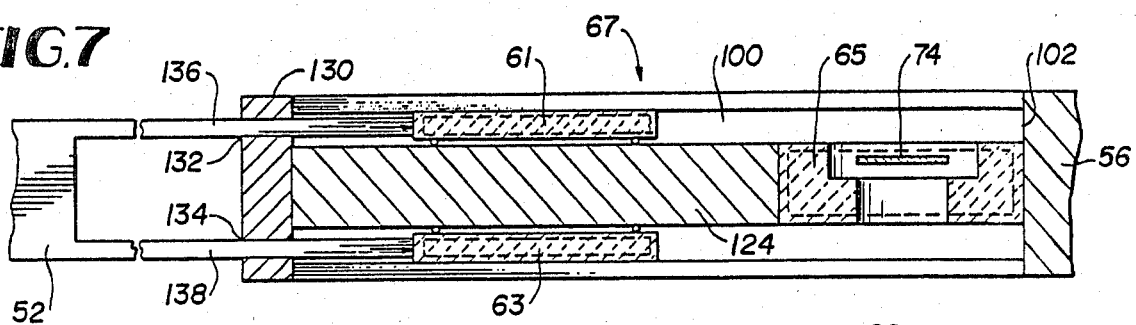
FIG. 7 is a sectional view of the component holder shown in FIG. 4 taken along the lines 7—7.

The component assembly wheel 56 is adapted to be rotated between the three processing stations, two of which are shown in FIG. 3. These include an electrode metallization station 64, situated in the region of the view ports 42 and 44 and a sealing station 66 located at the top of the chamber where the hydraulic actuators 38 and 40 are mounted. The third station is located intermittent the stations 64 and 66 and comprises a station 67 for positioning a pair of flat ceramic covers 61 and 63 over a ceramic resonator frame 65, shown in FIG. 10. The details and operation of station 67 is illustrated in FIGS. 5 through 7 and will be considered subsequently.

Figure 10:
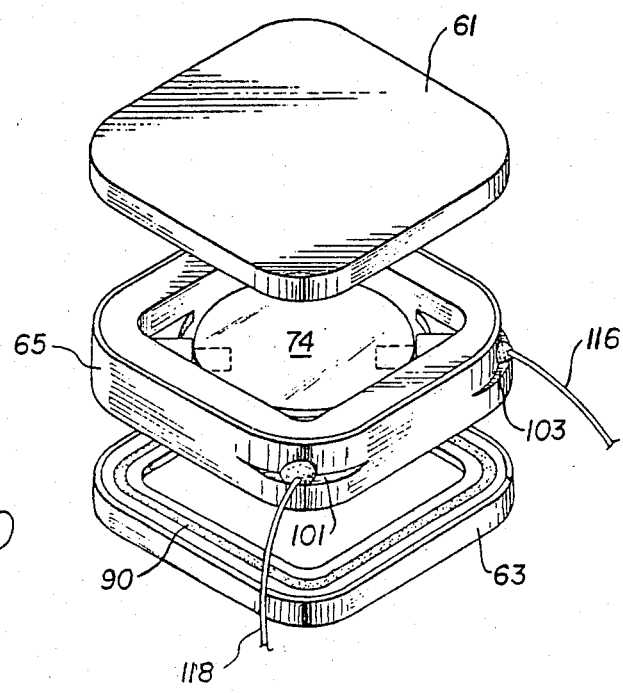
FIG. 10 is an exploded perspective view of a typical flat pack quartz crystal resonator package processed by the subject invention.

To complete the description of FIG. 3, the metallization station 64 is comprised of an evaporation mask assembly 68 and a pair of evaporant sources 70 and 72 which operate to apply a predetermined pattern of electrode metallization, e.g. gold on opposite faces of a disk type resonator element shown in FIG. 10 by reference numeral 74. Typical examples of the metallization sources 70 and 72 are disclosed in U.S. Pat. No. 4,125,086 issued on Nov. 14, 1978 to J. R. Vig, et al. These sources emit metal vapor in a horizontal direction and deposit a thin layer of gold on the resonator element in accordance with the pattern contained in the mask assembly 68. This type of apparatus is also well known, one form being shown in the aforementioned Hafner Patent, U.S. Pat. No. 4,300,272 entitled, "High Vacuum Continuous Cycle Fabrication Facility". Immediately above the evaporation source 72, FIG. 3 discloses the electrical feedthrough assembly 46. This assembly includes a linearly movable electrical contactor 76 which connects through a bellows member 78 to a linear actuator member 80 and a pair of electrical leads 81. These leads are coupled to an external power source, not shown, in order to energize the resonator blank during the process of metallization. Energizing the resonator blank, by means of one of the processes well-known in the art, is highly desirable at the metallization stage in order to obtain proper operating characteristics of the quartz resonator element 74. By energizing the element during and/or after the metallization pattern has been applied, the resultant resonance frequency and effective resistance of the element can be observed. If the simple energizing test indicates the presence of the frequency and resistance effects desired in the finished product then the metallization stage is complete and the element is ready to be moved on to the next processing stage. If the frequency is not at the desired "operating characteristic," the operator may desire additional metallization or trimming until the resonator element exhibits the ideal frequency, etc. results as determined by the energizing test.

At the upper end of the chamber 10, the hydraulic actuators 38 and 40 respectively couple to sealing rams 82 and 84 which additionally are adapted to be heated by encircling heating elements 86 and 88 so that the covers 61 and 63 (FIG. 10) can be press bonded and sealed to the resonator frame 65 by means of a thin gasket 90 of metallization preferably comprising gold, which rims the inner face of each cover. As shown, the sealing rams 82 and 84 which are actuated by the hydraulic members 38 and 40, pass through respective bellows 96 and 98 for protecting the integrity of the vacuum within the chamber 10.

Referring now to FIG. 4, the component assembly wheel 56, referred to in FIG. 3, is adapted to accommodate a plurality, e.g. eight separate sets of resonator components 61, 63 (not shown) and 65 in eight radially extending slots 100. These components are placed into the slots prior to the component wheel 56 being inserted into the high vacuum chamber 10. Insertion is by way of the view port 12 with the removal of the frame 18 containing the glass plate 20.

In the process of loading the components into each slot 100, a flat rectangular resonator frame 65 containing the resonator element 74 is manually inserted all the way into the slot 100 until it abuts the far inner wall 102 so that the frame's shoulder contact regions 101 and 103 (FIG. 10) face a pair of electrical contacts 104 and 106 mounted in an insulated pad 108. The contacts 104 and 106 are adapted to make electrical contact with the energizing contactor 76 shown in FIG. 3. After the resonator frame 65 is placed into the slot 100 it is held in place by a pair of spring clips 112 and 114 shown in FIG. 6. With the frame in place, a pair of metal conductor e.g. gold leads 116 and 118 are ball bonded between the electrical contacts 104 and 106 and the shoulder contact regions 101 and 103. When desirable the leads can be ultrasonically welded or thermo-compression bonded. Immediately behind each resonator frame 65 a spacer element 124 is slid into place which extends to the outer edge of the slot. Spacer element 124 is shown in cross section in FIG. 5 and is comprised of, for example, sapphire. The spacer 124 is adapted to accommodate the ceramic covers 61 and 63 on either side thereof with the covers themselves also being adapted to be held in place by pairs of spring elements 126 and 128 as shown in FIG. 5. With the components thus placed in position as shown in FIG. 4, respective end plates 130 are placed across the slot openings to hold the sapphire spacers 124 in place during wheel rotation. Each end plate, however, includes a pair of openings 132 and 134 for the entrance of a pair of push rod members 136 and 138, as shown in FIG. 7, which form part of or are connected to the linear mechanical actuator device 52 shown in FIGS. 1 and 2.

Figure 8:
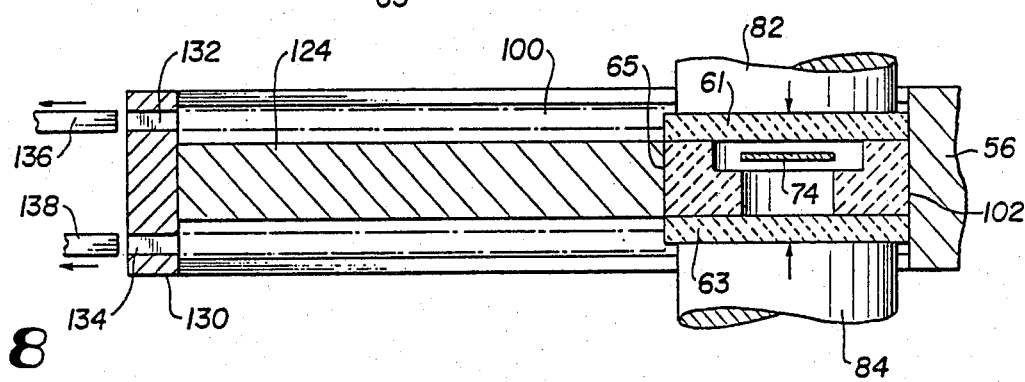
FIG. 8 is a sectional view corresponding to FIG. 7 and is helpful in understanding the operation of the subject invention with respect to one processing step.

As shown in FIGS. 7 and 8, at the intermediate station 67 which is between the metallization station 64 and the sealing station 66 an inward movement of the actuator 52 causes the members 136 and 138 to push the covers 61 and 63 past the sapphire spacer member 124 into registration with the resonator frame 65. Following this procedure, the members 136 and 138 are retracted after which the wheel is rotated 90° where, as shown in FIG. 8, actuation of the hydraulic ram actuators 38 and 40 causes the heated rams 82 and 84 as shown in FIG. 1 to hermetically seal the covers to the frame.

Thus what has been shown is apparatus capable of processing a plurality of ceramic flat pack resonators with the number being limited only by the size of the wheel. In operation, what is required is that each resonator frame 65 be brought into registration with the evaporation mask assembly 68 (FIG. 3), whereupon a gold electrode pattern is evaporated on each side of the respective resonator element 74 by means of the evaporation sources 70 and 72. During this time, the ceramic covers 61 and 63 are in the rearward position, as shown in FIG. 4. After the metallization step has been completed, the operator by means of the knob 48 rotates the component wheel 90° whereupon the linear actuator 52 causes the rod like elements 136 and 138 shown in FIG. 7 to push the covers 61 and 63 into position as shown in FIG. 8. Following this, the operator again rotates the component wheel 90° to the sealing station, whereupon the heated hydraulic rams 82 and 84 are actuated to bond the covers 61 and 63 to the frame 65, thus completing fabrication.

Insofar as cleaning and bake out is concerned, this may be implemented either within or from the outside of the high vacuum chamber 10. If done externally, heaters, not shown, would be located on the outside walls of the system. If done internally, heater means, not shown, would be provided at one of the processing stations before and/or after the metallizing station. As for cleaning the components, it may be done by: exposing the parts to ultra-violet (UV) energy from an outside lamp located adjacent the view ports, including large UV lamps inside the housing and irradiating the entire inside which would clean both the resonator components and system parts, or by placing a small, intense UV source at one or more processing stations. The latter two methods require additional electrical feed through means into the vacuum system.

What is also significant about the subject invention is that means are provided for energizing the respective quartz resonators elements 74 during the evaporation stage of fabrication which, if not highly desirable, is necessary for proper operating characteristics.

Following completion of the fabrication of a flat pack resonator unit, the valve 26 is closed and the wheel 56 is removed from the chamber 10 where the completed units are removed by releasing the end plates 130 from the respective slots 100 and taking out the sapphire spacers 124 following a cut-off of the leads 116 and 118 from the contact shoulders 101 and 103 and/or cut-off of the leads from the contacts 104 and 106. Following removal of the completed quartz resonator units, the assembly wheel 56 can be cleaned and reloaded for further operation. What is significant about the subject invention is that the plurality of processing steps are carried out in a single ultra-high vacuum chamber without any intermediate exposure to air.

While the foregoing detailed description has been made with a certain degree of particularity, the same is made by way of explanation and not of limitation. Accordingly, all modifications, alterations and substitutions coming within the spirit and scope of the present invention are herein meant to be included.

What is claimed is:

1. Apparatus for processing quartz crystal resonators in a relatively high vacuum environment, comprising:
   a unitary processing chamber including means for evacuating said chamber during a multi-step fabrication procedure;
   a rotatable resonator component holder, for at least one set of resonator components including a frame containing a resonator element, cover means therefore and a separator element for positioning cover means in spaced-apart relationship adjacent said frame, said holder being located in said chamber and removable therefrom;
   means for rotating said holder past a plurality of processing stations;
   means located at a first of said plurality of processing stations for applying a metallization pattern defining electrode means on said resonator element;
   means located at a second of said plurality of processing stations for positioning said cover means on said frame including an actuator means for moving said cover means past said separator element and into registration with said frame; and
   means located at a third of said plurality of processing stations for sealing said cover means on said frame to provide a hermetically sealed unit.

2. The apparatus as defined by claim 1 and additionally including means at said first processing station for energizing said resonator element during the application of said metallization pattern.

3. The apparatus as defined by claim 1 wherein said processing chamber is generally rectangular in cross section and has a removable viewport at one end which permits access to the interior of said chamber for removing and replacing said component holder.

4. Apparatus as defined by claim 3 wherein said processing chamber is generally rectangular in shape and has a flared end terminating in and additionally including valve and vacuum pump means coupled to the other end of said chamber for providing said relatively high vacuum environment.

5. The apparatus as defined by claim 1 wherein said processing chamber includes viewport means located in the vicinity of said first processing station for providing a means of visual alignment of said holder to said means to apply said metallization pattern.

6. The apparatus as defined by claim 1 wherein said means for applying said metallization pattern comprises an evaporation mask means positioned adjacent said holder and metal evaporation source means located in close proximity to said evaporation mask means for applying an electrode means to said resonator element.

7. The apparatus as defined by claim 1 wherein said means for sealing said cover means comprises at least one externally driven ram assembly located at said third processing station for sealing said cover means on said frame.

8. The apparatus as defined by claim 7 wherein said cover means comprises a pair of cover members and wherein said sealing means comprises a pair of opposing ram assemblies for pressure sealing said cover members on said frame.

9. The apparatus as defined by claim 8 and additionally including heater means on said ram assemblies for applying both heat and pressure to said cover members.

10. The apparatus as defined by claim 1 wherein said means located at said first, second and third processing stations are located in three separate quadrants or sections of said processing chamber.

11. The apparatus as defined by claim 1 wherein said rotatable component holder comprises a generally flat wheel-like member having a plurality of radial slots formed therein, for holding one set of said resonator components each.

12. The apparatus as defined by claim 11 and additionally including electrical means located adjacent each slot for coupling an energization potential to the resonator element in the respective frame located in each said slot.

13. The apparatus as defined by claim 12 and additionally including means located in said first processing station for selectively coupling an externally applied energization potential to said electrical means.

14. The apparatus as defined by claim 11 and additionally including means secured to the perimeter of said holder for retaining said separator element and said resonator components in said slot.

15. The apparatus as defined by claim 11 and wherein said positioning means comprises a linear actuator mounted on said processing chamber and including push rod means for, when activated, moving said pair of cover means into registration with said frame.

16. The apparatus as defined by claim 15 wherein said frame and cover members are generally rectangular in shape thereby providing a flat pack unit type of crystal resonator.

17. The apparatus as defined by claim 1 wherein said rotatable component holder is generally circular in configuration and additionally includes means for selectively rotating said holder from outside of said processing chamber.

18. The apparatus as defined by claim 16 wherein said component holder of generally circular configuration includes a plurality of radial slots which are oriented at substantially equal intervals with respect to one another.

* * * * *